US006407359B1

(12) United States Patent
Lagarde et al.

(10) Patent No.: US 6,407,359 B1
(45) Date of Patent: Jun. 18, 2002

(54) METHOD OF PRODUCING INDIVIDUAL PLASMAS IN ORDER TO CREATE A UNIFORM PLASMA FOR A WORK SURFACE, AND APPARATUS FOR PRODUCING SUCH A PLASMA

(75) Inventors: Thierry Lagarde, Vif; Jacques Pelletier, Saint Martin d'Heres, both of (FR)

(73) Assignee: Metal Process (Societe a Responsabilite Limitee), Montevrain (FR)

( * ) Notice: Subject to any disclaimer, the term of this patent is extended or adjusted under 35 U.S.C. 154(b) by 0 days.

(21) Appl. No.: 09/631,347

(22) Filed: Aug. 2, 2000

(30) Foreign Application Priority Data

Aug. 4, 1999 (FR) .............................. 99 10291

(51) Int. Cl.[7] .............................................. B23K 10/00
(52) U.S. Cl. ............................. 219/121.43; 219/121.52; 315/111.21
(58) Field of Search ...................... 219/121.43, 121.41, 219/121.54, 121.52, 121.48, 121.49, 121.38, 121.36; 315/111.21, 111.51, 111.41

(56) References Cited

U.S. PATENT DOCUMENTS 4,473,736 A 9/1984 Bloyet et al.
5,111,111 A * 5/1992 Stevens et al. ......... 315/111.41
5,180,948 A 1/1993 Heinemann et al.
5,536,914 A * 7/1996 Pelletier et al. ........ 219/121.48
5,726,413 A * 3/1998 Baenziger et al. ...... 219/121.43
6,198,224 B1 * 3/2001 Spitzl et al. ............ 315/111.21

FOREIGN PATENT DOCUMENTS

| EP | 0613329 | 8/1994 |
| EP | 0711100 | 5/1996 |
| JP | 05314918 | 11/1993 |

* cited by examiner

Primary Examiner—Teresa Walberg
Assistant Examiner—Quang Van
(74) Attorney, Agent, or Firm—Dennison, Schultz & Dougherty

(57) ABSTRACT

The invention provides apparatus having a series of individual plasma excitation devices each constituted by a wire applicator of microwave energy, having one end connected to a source for producing microwave energy and having an opposite end fitted with at least one magnetic dipole for creating at least one surface having a magnetic field that is constant and of intensity corresponding to electron cyclotron resonance, the dipole being mounted at the end of the microwave applicator in such a manner as to ensure that electrons accelerated to electron cyclotron resonance oscillate between the poles so as to create a plasma diffusion zone situated on the side of the dipole that is remote from the end of the applicator, the individual excitation devices being distributed relative to one another and in proximity with the work surface so as to create together a plasma that is uniform for the work surface.

13 Claims, 4 Drawing Sheets

METHOD OF PRODUCING INDIVIDUAL PLASMAS IN ORDER TO CREATE A UNIFORM PLASMA FOR A WORK SURFACE, AND APPARATUS FOR PRODUCING SUCH A PLASMA

FIELD OF THE INVENTION

The present invention relates to the general technical field of producing a low-pressure plasma excited by microwave energy in the electron cyclotron resonance range.

The invention relates to all applications requiring controllable plasma uniformity over large areas that can be plane or curved in shape.

The present invention relates to a wide variety of applications, such as surface treatments, e.g. etching, deposition, chemical or thermochemical treatment, spraying, cleaning, disinfection, decontamination, or producing ion beams obtained by extracting plasma.

BACKGROUND OF THE INVENTION

In the technical field of exciting a plasma to electron cyclotron resonance, resonance is obtained when the frequency of gyration of an electron in a static or quasi-static magnetic field is equal to the frequency of the applied accelerating electric field. This resonance is obtained for a magnetic field B at an excitation frequency f which are associated by the following relationship:

$$B = 2\pi mf/e$$

where m and e are the mass and the charge of an electron.

When exciting a plasma, electron cyclotron resonance is effective only if the electron is sufficiently accelerated, i.e. if the electron can revolve in phase with the electric field for long enough to acquire the threshold energy necessary for ionizing the gas. To satisfy this condition, it is necessary firstly for the radius of gyration of the electron to be small enough, in particular to enable it to remain in that region of space in which resonance conditions exist, i.e. the simultaneous presence of the electric field and of the magnetic field, and secondly that the frequency of gyration f remains large relative to the frequency of collision between electrons and neutral elements such as atoms and/or molecules. In other words, the best conditions for exciting a plasma to electron cyclotron resonance are obtained when simultaneously gas pressure is relatively low and the electric field frequency f is high, which also means that the magnetic field intensity B must be high.

French patent No. 85 08 836 describes a technique for exciting a plasma to electron cyclotron resonance that requires permanent magnets to be used, each creating at least one surface at constant magnetic field and at an intensity corresponding to electron cyclotron resonance. Microwave energy is supplied to the resonance zone by antennas or plasma exciters each constituted by a metal wire element. Each exciter extends close to and along a magnet, being located in register with a permanent magnet.

The magnetic field of intensity equal to the value giving resonance and the microwave electric field are both located and confined essentially in the space situated between an exciter and the portion of the wall of the enclosure placed facing a magnet. In the presence of a gaseous medium at low pressure, electrons are accelerated in the resonance zone and wind along magnetic field lines which define a plasma confinement surface. The field lines form festoons connecting the pole of one magnet to its opposite pole or to the opposite pole of a consecutive magnet. Along its path, an electron dissociates and ionizes any molecules and atoms with which it comes into collusion. The plasma formed in this way in the festoons of the magnetic fields then diffuses away from the field lines to form a plasma that is practically free from the high energy electrons since they remain trapped in the festoons.

The major drawback of the technique described in that patent lies in the fact that the zone in which microwave energy propagates and the resonance zone in which the microwave energy is absorbed are superposed. Microwave propagation can therefore take place only with losses, and the intensity of the microwave electric field and the density of the plasma both diminish progressively along the exciter starting from the microwave source. The resulting plasma presents density that is not uniform along the exciter, and as a result such a plasma appears to be unsuitable for most industrial applications.

A variant of the above-described technique constitutes the subject matter of French patent No. 93 02 414. In that technique, the microwaves are applied directly to one of the ends of the magnetic field applicator constituted by permanent magnets or by a conductor carrying an electric current. In that case also, the microwave propagates mainly in the electron cyclotron resonance zone and are therefore subjected to a high level of attenuation, which leads to a plasma being produced that is not uniform along the magnet. The advantage of that solution compared with the preceding technique is firstly simplification of the apparatus, and secondly increased efficiency in plasma excitation insofar as the intensity of the magnetic field and the intensity of the microwave electric field are both at respective maxima at the surface of the applicator.

In order to remedy non-uniformity in the plasma associated with propagation of a highly attenuated traveling wave, French patent No. 91 00 894 proposes exciting the plasma by means of a standing wave of constant amplitude. To this end, it proposes causing microwaves to propagate in a zone that is distinct from that in which electron cyclotron resonance conditions are satisfied. The solution proposed is to apply the microwave power by means of a wire applicator situated, not facing the poles of the magnet, but halfway between two adjacent opposite poles in the zone that is forbidden to the plasma. Thus, it is possible to obtain a plasma that is uniform along the magnets, with the maxima and minima of the microwave fields due to the standing wave along the magnets being leveled out by the drift velocity of the electrons along the magnets, perpendicularly to the plane of the magnetic field.

Generalized use of standing waves for exciting uniform plasmas at electron cyclotron resonance is proposed in French patent No. 94 13 499 where the establishment of standing waves is controlled by adding wire propagators to the microwave applicator, which propagators are located outside the absorption zone for microwaves at electron cyclotron resonance.

Nevertheless, the techniques described in those patents No. 91 00 894 and 94 13 499 where microwave propagation takes place in the form of standing waves suffers from the difficulty of obtaining constant amplitude, in particular over a relatively long length of the microwave applicator. In addition, adjusting uniformity and amplitude generally requires impedance matching to be used upstream from the microwave applicator.

An analysis of the various prior art techniques leads to non-uniformities being observed in the electric field and in the plasma along the applicators, which non-uniformities are due to the very high attenuation of the electric field by resonant absorption of the microwave power by electrons at electron cyclotron resonance. In other words, the techniques described above do not enable a uniform plasma to be produced over a long length, and thus over a large area, typically of dimensions of meter order or greater. In addition, those techniques present a major drawback, that of microwaves being radiated from the applicators and propagators due to poor confinement of the microwave power in the propagation zone. This gives rise to coupling between the applicators that can be particularly harmful for obtaining good plasma uniformity. Another drawback lies in the difficulties of making non-rectilinear applicators or propagators and of inserting them into an evacuated enclosure. This makes it practically impossible to treat curved surfaces uniformly.

OBJECTS AND SUMMARY OF THE INVENTION

The object of the invention is thus to remedy the drawbacks of the prior art by proposing a method that makes it possible to produce a plasma that is uniform relative to a work surface of relatively large dimensions.

Another object of the invention is to provide a method of producing a plasma that is uniform relative to a work surface that is plane or curved in shape.

To achieve the various objects specified above, the present invention provides a method of producing a plasma for a work surface by means of apparatus comprising means for producing energy in the microwave range and means for creating at least one surface having a magnetic field that is constant and of intensity corresponding to electron cyclotron resonance, and that is placed at least in the microwave propagation zone for the purpose of plasma excitation.

According to the invention, the method consists:

in making a series of individual plasma excitation devices each constituted by a microwave energy wire applicator having one end connected to a source for producing microwave energy and having its opposite end fitted with at least one magnetic dipole as means for creating at least one surface having a magnetic field that is constant and of intensity corresponding to electron cyclotron resonance;

in mounting the magnetic dipole at the end of the microwave applicator in such a manner as to cause electrons accelerated to electron cyclotron resonance to oscillate between the poles so as to create a plasma diffusion zone situated at least on the side of the dipole that is remote from the end of the applicator; and in distributing the individual plasma excitation devices relative to one another and in proximity relationship with the work surface in such a manner as to obtain at least juxtaposition between the plasmas produced by each of the individual devices so as to create a plasma that is uniform for the work surface.

In another aspect, the invention seeks to provide means for producing energy in the microwave range and means for creating at least one surface having a magnetic field that is constant and of intensity corresponding to electron cyclotron resonance, and that is placed at least in register with the microwave propagation zone in order to excite the plasma.

According to the invention, the apparatus comprises a series of individual plasma excitation devices each constituted by a microwave energy wire applicator having one end connected to a source for producing microwaves and whose other end is fitted with at least one magnetic dipole constituting means for creating at least one surface having a magnetic field that is constant and of intensity corresponding to electron cyclotron resonance, the dipole being mounted at the end of the microwave applicator so as to ensure that electrons accelerated to electron cyclotron resonance oscillate between the poles so as to create a plasma diffusion zone situated on the side of said dipole that is remote from the end of the applicator, the individual excitation devices being distributed relative to one another and in proximity with the work surface in such a manner as to create together a plasma that is uniform for the work surface.

BRIEF DESCRIPTION OF THE DRAWINGS

Various other characteristics appear from the following description given with reference to the accompanying drawings which show embodiments and implementations of the invention, as non-limiting examples.

MORE DETAILED DESCRIPTION

Figure 1:
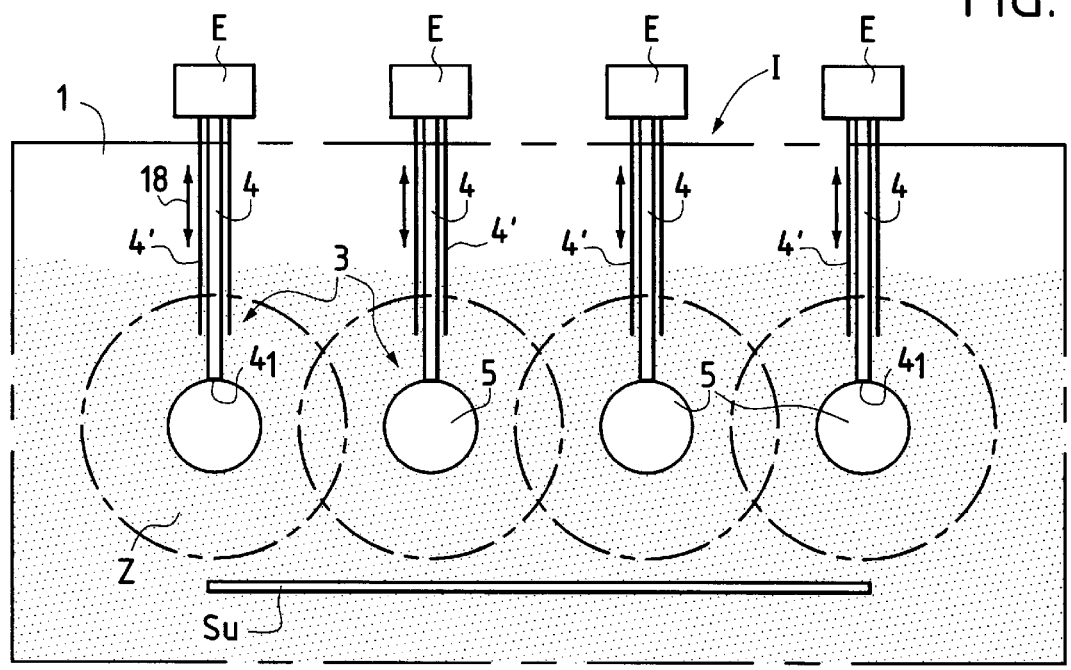
FIG. 1 is a diagrammatic elevation view showing plasma production apparatus in accordance with the invention.
Figure 2:
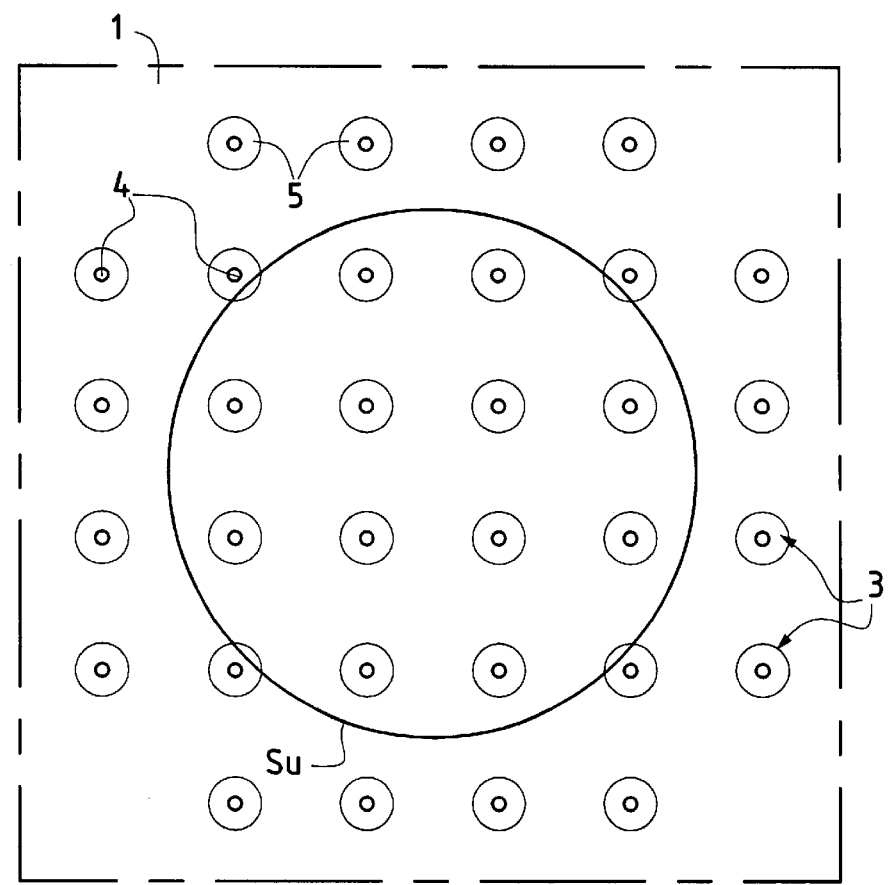
FIG. 2 is a plan view showing an embodiment of plasma production apparatus in accordance with the invention.

By way of example, FIGS. 1 and 2 show apparatus I for producing a plasma relative to a work surface $S_u$ ("work" in a broad sense), which can be constituted, for example, by a surface that is suitable for receiving various surface treatments. In conventional manner, the apparatus I comprises a sealed enclosure 1 represented diagrammatically and fitted with devices for admitting gas and for pumping gas out, not shown but known per se, that enable the pressure of the gas that is to be ionized to be maintained at a desired value which, for example, can be about $10^{-3}$ to a few tens of Pascals, depending on the nature of the gas and the excitation frequency.

In accordance with the invention, the plasma production apparatus I has a series of individual plasma excitation devices 3 spaced apart from one another and located in the proximity of the work surface $S_u$ so as to operate together to create a plasma that is uniform for said work surface $S_u$. In the invention, each individual plasma excitation device 3 is constituted by a microwave energy applicator 4 implemented in the form of a wire, i.e. that is elongate. The wire applicator 4 has one of its ends connected to a microwave energy source E (preferably via a coaxial structure 4'), which source lies outside the enclosure 1. Each wire applicator 4 is thus advantageously in the form of a tube surrounded by a coaxial tube 4', thus enabling microwave energy to propagate to the free end $4_1$ thereof while avoiding radiating microwaves and avoiding microwave coupling between the applicators.

Figure 3:
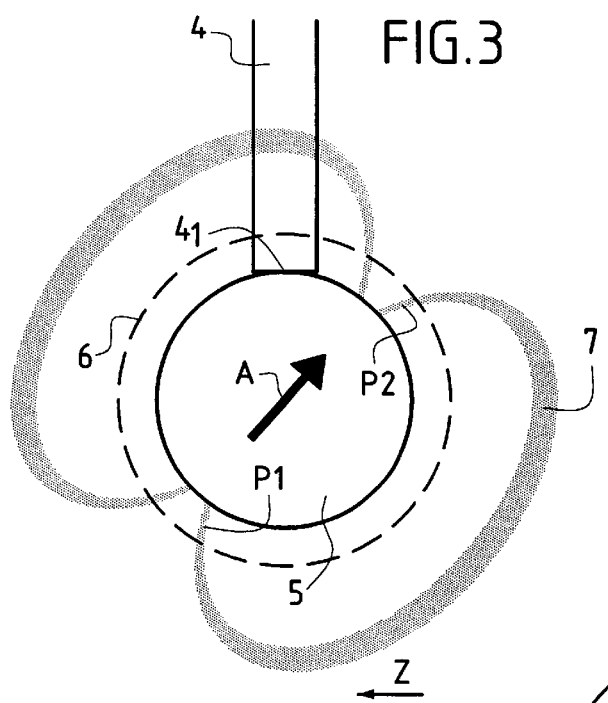
FIGS. 3 to 8 show various variant embodiments of individual plasma excitation devices forming parts of plasma production apparatus in accordance with the invention.

According to another characteristic of the invention as shown more particularly in FIG. 3, each microwave applicator 4 is designed to have its end $4_1$ remote from its end connected to the microwave energy source E to be connected to at least one magnetic dipole 5 adapted to create at least one magnetic field surface 6 at an intensity corresponding to electron cyclotron resonance. In the embodiment shown in FIG. 3, the magnetic dipole 5 is constituted by a spherically-shaped permanent magnet of arbitrary magnetization direction A and of arbitrary position for its north and south poles N and S relative to the point at which the microwaves are applied, i.e. the end 4, of the applicator. This permanent magnet 5 thus creates a surface 6 around the sphere which corresponds to the condition required for electron cyclotron resonance, while the lines 7 represent magnetic field lines which interconnect the two opposite poles of the magnet and which converge on said poles. Between two collisions, electrons accelerated in the resonance zone 6 by the microwave electric field applied by the wire applicator 2 oscillate between the north pole and the south pole and between the field lines 7. Advantageously, these accelerated electrons at electron cyclotron resonance oscillate between mirror points $P_1$ and $P_2$ situated close to and facing each pole, and both presenting the same magnetic field intensity, in application of the theory described in the book entitled "Microwave Excited Plasma", Chapter 12, page 368, by M. Moisan and J. Pelletier, published by Elsevier, Amsterdam (1992). These electrons are also subjected to drift movement around the magnetization axis of the magnet, with magnetic drift being due to the curvature and the gradient of the magnetic field. The plasma produced by the electrons along their trajectories then diffuses away from the source zone under the influence of plasma density gradients. There thus appears a plasma diffusion zone Z situated at least on the side of the dipole 5 that is remote from the end $4_1$ of the applicator.

In the embodiment shown in FIG. 3, it should be observed that at least a fraction of the electron paths encounter the wire applicator 4 such that a fraction of the electrons is thus collected by the wire applicator 4, thereby giving rise to a loss of electrons.

Figure 4:
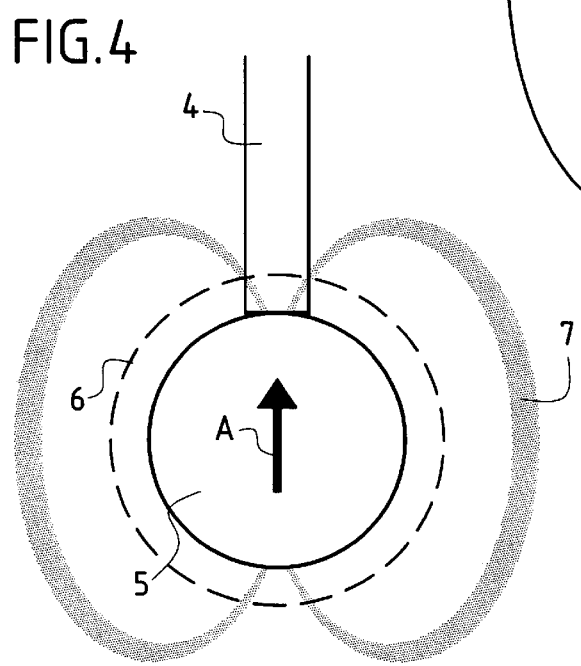

To avoid this loss of electrons, provision can be made, as shown in FIG. 4, to place the magnetic dipole 5 in such a manner that its magnetization axis A is situated substantially parallel to the axis of the wire applicator. The magnetization axis A of the magnetic dipole 5 is preferably situated in line with the axis of the wire applicator 4. In this example, the electron paths no longer encounter the wire applicator 4 so the electrons can continue to follow their paths without obstacle between two elastic or inelastic collisions. In this type of operation, a three-dimensional magnetic structure of the magnetron type is thus obtained in which electrons can oscillate and drift indefinitely without being lost to the walls. In fact, fast electrons or primary electrons, accelerated by electron cyclotron resonance, inevitably lose energy by producing the plasma and thus become slow electrons or thermal electrons that thus contribute part of the electron population of the plasma.

In the embodiments shown in FIGS. 3 and 4, the permanent magnets 5 are shown as being spherical in shape. In the context of the invention, the shape for the magnets is of little importance and they can be arbitrary in shape or indeed complex in shape (rings, toruses, parallelepipeds, etc.) and they can possess a wide variety of magnetizations (e.g. axial, diametral, or radial). Nevertheless, the magnets 5 must present sufficient magnetization to generate conditions suitable for electron cyclotron resonance. Furthermore, as with spherical magnets, it is preferable for the magnets to be able to constitute a magnetron type structure in which the application of microwaves does not give rise to electron loses.

Figure 5:
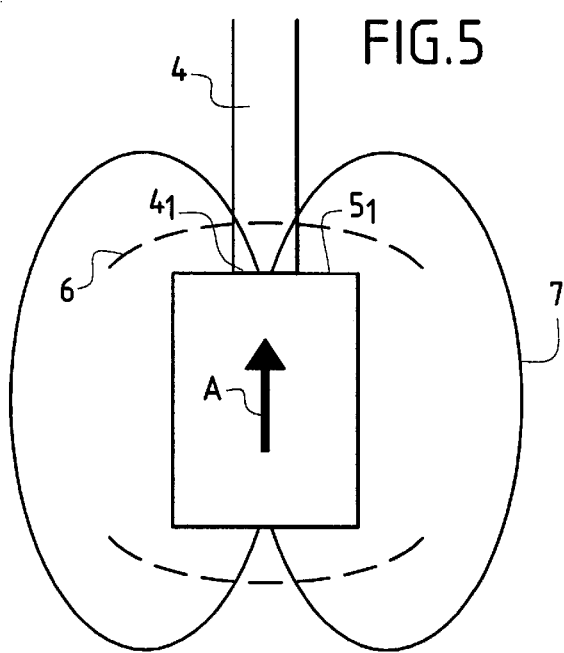

In a preferred embodiment as shown in FIG. 5, each dipole 5 is constituted by a magnet of cylindrical shape having axial magnetization A lying substantially in line with the axis of the wire applicator 4. One of the poles of the magnet defined by a transverse surface $5_1$ is designed to come into contact with the end $4_1$ of the applicator for applying microwaves. A magnetic structure of the magnetron type is thus obtained which is circularly symmetrical. In this embodiment, it should be observed that some of the field lines 7 converge on the pole situated at the end $4_1$ of the applicator, and therefore encounter said wire applicator 4, which likewise gives rise to significant electron losses.

Figure 6:
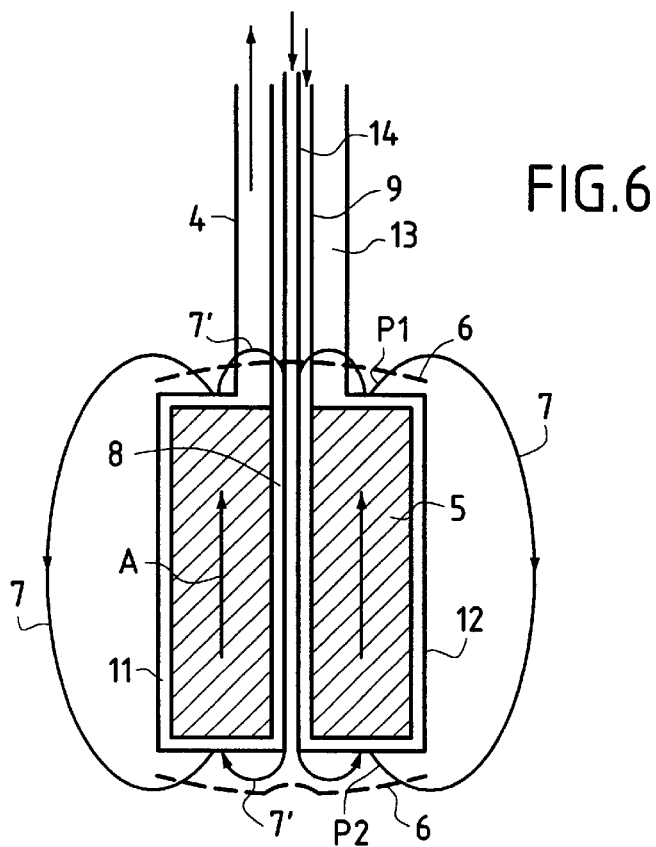

To avoid that drawback, provision can be made to implement an axially-magnetized cylindrical magnet 5 having a central bore 8 on its magnetization axis. In this embodiment as shown in FIG. 6, a fraction 7' of the magnetic field lines pass along the central bore 8 of the magnet. Furthermore, the magnetic poles are no longer points but describe circles centered on the axis of revolution of the magnet and towards which the magnetic field lines 7 and 7' converge. Thus, if the diameter of the outer envelope of the applicator 4 is equal to the diameter of the circle described by the magnetic pole, electrons accelerated by electron cyclotron resonance cannot describe trajectories that follow the field lines 7'. As a result, the end $4_1$ of the wire applicator does not go past the magnetic pole. The only usable field lines are therefore the field lines 7 external to the magnet, and consequently no electron path encounters the wire applicator 4 between the two mirror points $P_1$ and $P_2$. As a result no electrons are lost and optimum performance can be obtained in terms of energy efficiency.

In this preferred characteristic of the invention, each axial bore 8 can be used to enable a cooling fluid feed pipe 9 to be installed which advantageously also serves as a support on which the magnet 5 is mounted. This pipe 9 is implemented in the form of a tube whose end communicates with an enclosure 11 defined between the magnet and a jacket 12 surrounding the magnet at a distance therefrom. The enclosure 11 opens out into a cooling fluid return pipe 13 defined between the feed pipe 9 and the wire applicator 4 constituted by a tube. The magnet 4 is thus encapsulated by the protective jacket 12 that enables a cooling fluid to circulate around the magnet. By way of example, the material in which the magnet is encapsulated and the material constituting the wire applicators is a non-magnetic material that is a good conductor (a non-magnetic metal), however for contamination reasons, they can also be surrounded by dielectric materials without spoiling proper operation of the device.

In another possible implementation, it should be observed that each magnetic dipole 5 could be fitted with a pipe 14 for feeding a gas that passes through the magnetic dipole via its axial bore 8. By way of example, the pipe 14 is mounted inside the feed pipe 9 so as to open out at the opposite end of the jacket 12.

Figure 7:
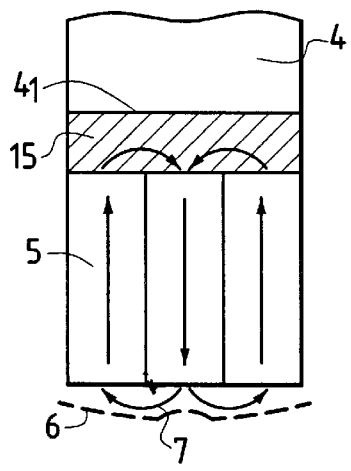

FIG. 7 shows another variant in which each magnetic dipole 5 has a pole face defined by a material 15 having high magnetic permeability, for example a plate of soft iron, which plate has the end $4_1$ of the wire applicator 4 mounted thereon. Such a magnetic dipole 5 is built up to present adjacent magnetic poles. Thus, as can be seen in FIG. 7, it is possible to use concentric magnets with adjacent north and south poles mounted in alternate opposite directions to produce field lines 7 that are established between pairs of consecutive adjacent poles situated on a pole face that is remote from the pole face constituted by the plate 15.

Figure 8:
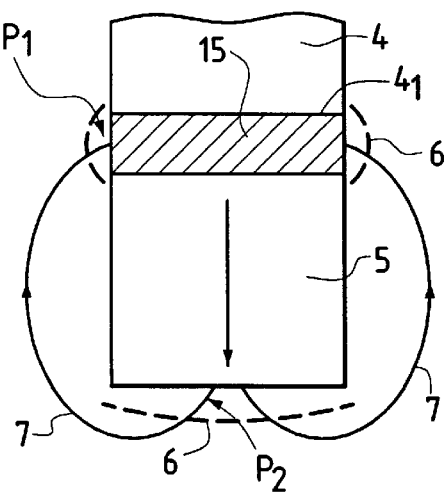

FIG. 8 shows a variant of the embodiment shown in FIG. 7. In this variant, the magnetic dipole 5 has a pole face defined by the plate 15 on which the end $4_1$ of the wire applicator 4 is mounted. The dipole 5 is constituted by an axially-magnetized magnet extending the axis of the wire applicator 4. In this configuration, electrons are accelerated to electron cyclotron resonance from corresponding lines 6 and they oscillate between two mirror points $P_1$ and $P_2$. One of these points $P_1$ is no longer situated facing the pole of the magnet, but on the side, along the wire applicator 4, while the other point $P_2$ remains facing the pole. Thus, the presence of the plate 15 located beyond the end $4_1$ of the wire applicator serves to modify the position in space of the mirror points $P_1$ and $P_2$ that are associated with the poles of each magnetic dipole 5. These two embodiments shown in FIGS. 7 and 8 are not limiting and other positions relative to the material(s) 15 can be found relative to the configuration of the magnets 5.

As can be seen directly from the above description, the method of the invention thus consists in setting up a series of individual plasma excitation devices 3 each of which enables at least one surface 6 having a constant magnetic field to be established at an intensity which corresponds to electron cyclotron resonance. A magnetic dipole 5 is mounted at the end of the microwave applicator so as to ensure that electrons oscillate between the poles so as to establish a plasma diffusion zone Z situated at least on the side of the dipole that is remote from the end $4_1$. Thereafter, provision is made to distribute the individual plasma excitation devices 3 relative to one another and close to the work surface $S_u$ in such a manner as to obtain at least one juxtaposition between the plasmas produced by each of the individual devices so as to create a uniform plasma for the work surface. It should be understood that the individual plasmas produced by the devices 3 overlap or overlie one another at least in part, thereby obtaining a plasma that is uniform for the work surface $S_u$.

In a preferred characteristic of the invention, provision is made to adjust the distance between the individual excitation devices 3 and the work surface $S_u$ so as to adjust plasma excitation to the profile of the work surface. Thus, as can be seen more clearly in FIGS. 1 and 9, each individual plasma excitation device 3 has means 18 for adjusting the actual position of the wire applicator so as to adjust the distance between each individual device 3 and the work surface $S_u$ to be treated. This makes it possible to obtain a relative disposition between the devices and the work surface that provides best possible matching to the profile of the work surface, e.g. a curved surface. Furthermore, the microwave power delivered by each individual excitation device 3 can also be adjusted so as to adapt plasma uniformity.

Figure 9:
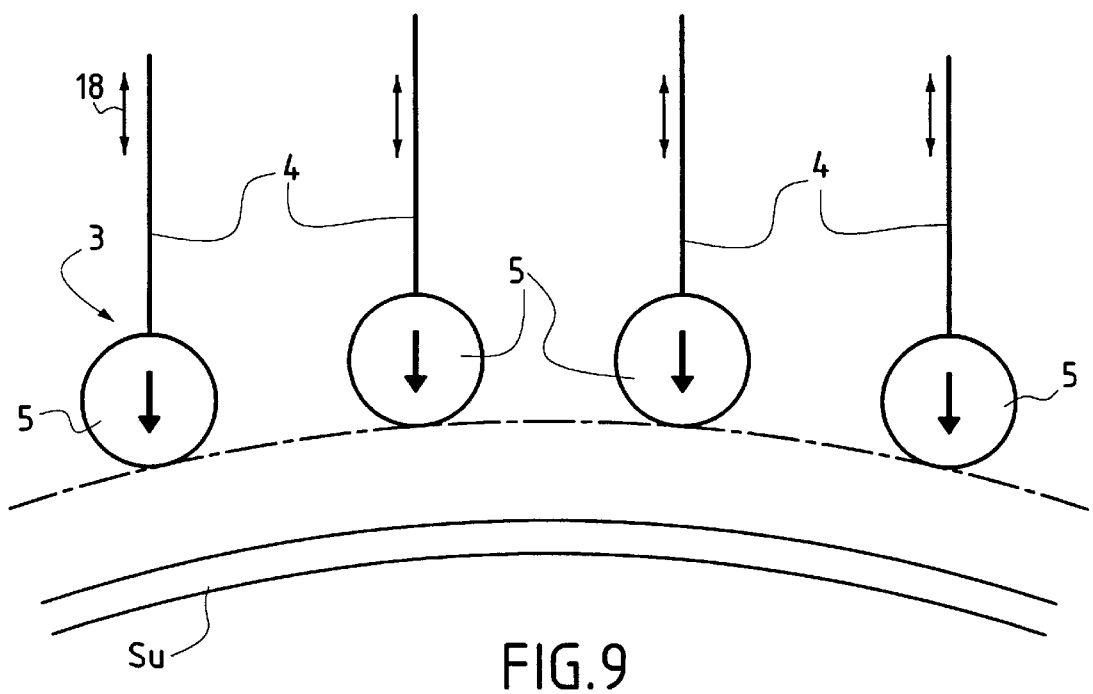
FIGS. 9 and 10 are diagrams showing ways in which individual excitation devices can be assembled relative to one another.

In the embodiment shown in FIG. 9, the elementary plasma excitation devices 3 are distributed in such a manner that the magnetic dipoles 5 possess magnetization axes that are all oriented in the same direction. This makes it possible to obtain a magnetic field remote from the dipoles 5 that diverges little and that is of intensity which decreases slowly.

Figure 10:
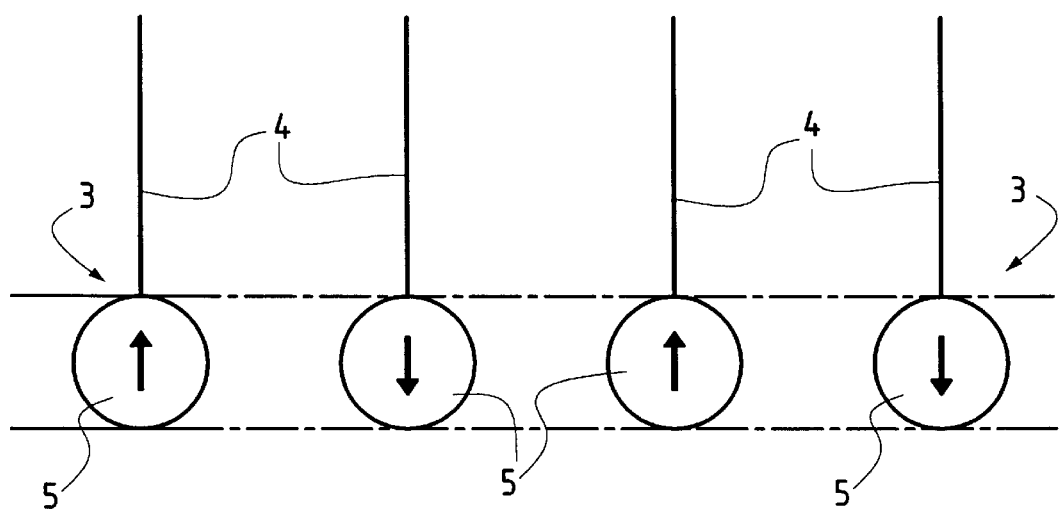

In the example shown in FIG. 10, provision is made for the individual plasma excitation devices 3 to be distributed in such a manner that the magnetic dipoles 5 possess magnetization axes that alternate between opposite directions of orientation from one device to an adjacent device. This provides a conventional multipolar structure in which the intensity of the magnetic field falls off quickly and almost exponentially as a function of distance away from the magnets.

From the above description, it can be seen that the invention makes it possible to obtain plasma uniformity that does not depend on microwave propagation conditions and that makes it possible to treat work surfaces of large dimensions.

The main fields of application for the invention are those that involve uniform treatment (cleaning, deposition, etching, etc.) of surfaces of large dimensions which can be plane or skew. By way of example, in the manufacture of integrated circuits, it is possible to perform surface treatments on silicon wafers having a diameter of 300 mm by using an array of 32 individual sources spaced apart at 60 mm intervals (FIG. 2). The cylindrical magnets are made of samarium-cobalt (Sm-Co), they are 20 mm in diameter and 30 mm long, and they are made in the manner shown in FIG. 6. The plasma is excited to electron cyclotron resonance by microwaves of 2.45 GHz and the resonance condition ($B_0$= 0.0875 tesla) is easily satisfied by the permanent magnets used. For all types of method that have been developed, the resulting uniformity has been better than ±5%.

The invention is not limited to the examples described and shown, and various modifications can be applied thereto without going beyond the ambit of the invention.

What is claimed is:

1. A method of producing a plasma for a work surface by means of apparatus comprising means for producing energy in the microwave range and means for creating at least one surface having a magnetic field that is constant and of intensity corresponding to electron cyclotron resonance, and that is placed at least in the microwave propagation zone for the purpose of plasma excitation, the method comprising the steps of:

in making a series of individual plasma excitation devices each constituted by a microwave energy wire applicator having one end connected to a source for producing microwave energy and having its opposite end fitted with at least one magnetic dipole as means for creating at least one surface having a magnetic field that is constant and of intensity corresponding to electron cyclotron resonance, and wherein the power of the microwave energy of each individual excitation device is adjusted so as to adjust the uniformity of the plasma;

in mounting the magnetic dipole at the end of the microwave applicator in such a manner as to cause electrons accelerated to electron cyclotron resonance to oscillate between the poles so as to create a plasma diffusion zone situated at least on the side of the dipole that is remote from the end of the applicator; and in distributing the individual plasma excitation devices relative to one another and in proximity relationship with the work surface in such a manner as to obtain at least juxtaposition between the plasmas produced by each of the individual devices so as to create a plasma that is uniform for the work surface.

2. A method according to claim 1, comprising the additional steps of adjusting the distance between the individual excitation devices and the work surface so as to adjust plasma excitation to the profile of the work surface.

3. A method according to claim 1, consisting in distributing the individual plasma excitation devices in such a manner that the magnetic dipoles posses magnetization axes that are all oriented in the same direction.

4. A method according to claim 1, consisting in distributing the individual plasma excitation devices in such a manner that the magnetic dipoles possess magnetization axes that are oriented in alternation from one device to an adjacent device.

5. Apparatus for producing a plasma for a work surface, the apparatus comprising means for producing energy in the microwave range and means for creating at least one surface having a magnetic field that is constant and of intensity corresponding to electron cyclotron resonance, and that is placed at least in register with the microwave propagation zone in order to excite the plasma, the apparatus comprising a series of individual plasma excitation devices each constituted by a microwave energy wire applicator having one end connected to a source for producing microwaves and adapted to adjust the microwave power delivered by each individual excitation device so as to adapt plasma uniformity, and wherein other end is fitted with at least one magnetic dipole constituting means for creating at least one surface having a magnetic field that is constant and of intensity corresponding to electron cyclotron resonance, the dipole being mounted at the end of the microwave applicator so as to ensure that electrons accelerated to electron cyclotron resonance oscillate between the poles so as to create a plasma diffusion zorlie situated on the side of said dipole that is remote from the end of the applicator, the individual excitation devices being distributed relative to one another and in proximity with the work surface in such a manner as to create together a plasma that is uniform for the work surface.

6. Apparatus according to claim 5, wherein each individual excitation device includes at least one magnetic dipole whose magnetization axis is situated substantially parallel to the axis of the wire applicator.

7. Apparatus according to claim 5, wherein each magnetic dipole has at least one material of high magnetic permeability located beyond the end of the wire applicator in such a manner as to modify the positions of mirror points associated with each pole of a magnetic dipole, and between which the electrons accelerate to electron cyclotron resonance oscillate.

8. Apparatus according to claim 5, wherein each magnetic dipole is constituted by an axially-magnetized cylinder in which an axial bore is provided, and wherein the diameter of the wire applicator is equal to the diameter of the circle described by the magnetic pole so as to avoid it intersecting the trajectories of electrons accelerated to electron cyclotron resonance.

9. Apparatus according to claim 8, wherein each magnetic dipole is fitted with a gas feed pipe passing through the magnetic dipole along its axial bore.

10. Apparatus according to claim 5, wherein each magnetic dipole is provided with a cooling fluid feed pipe mounted in an axial bore and communicating with an enclosure surrounding the magnetic dipole and opening out into a cooling fluid return pipe.

11. Apparatus according to claim 10, wherein the cooling fluid return pipe is defined between the feed pipe and a tube constituting the wire applicator.

12. Apparatus according to claim 5, wherein each individual plasma excitation device is fitted with axial displacement means enabling the distance between the work surface and the magnetic dipole to be adjusted.

13. Apparatus according to claim 5, wherein each wire applicator is connected by a coaxial structure to a source of energy in the microwave range, lying outside the enclosure.

* * * * *